(12) United States Patent
Hebert et al.

(10) Patent No.: US 9,401,401 B2
(45) Date of Patent: Jul. 26, 2016

(54) SEMICONDUCTOR DEVICE

(71) Applicant: MagnaChip Semiconductor, Ltd., Cheongju-si (KR)

(72) Inventors: Francois Hebert, San Mateo, CA (US); I-Shan Sun, San Jose, CA (US); Youngbae Kim, Cheongju-si (KR); Youngju Kim, Cheongju-si (KR); Kwangil Kim, Cheongju-si (KR); Intaek Oh, Cheongju-si (KR); Jinwoo Moon, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/218,021

(22) Filed: Mar. 18, 2014

(65) Prior Publication Data

US 2015/0041892 A1    Feb. 12, 2015

Related U.S. Application Data

(60) Provisional application No. 61/863,978, filed on Aug. 9, 2013.

(30) Foreign Application Priority Data

Aug. 9, 2013    (KR) .................... 10-2013-0095040

(51) Int. Cl.
| | | |
|---|---|---|
| *H01L 29/10* | (2006.01) | |
| *H01L 29/78* | (2006.01) | |
| *H01L 29/66* | (2006.01) | |
| *H01L 29/06* | (2006.01) | |
| *H01L 21/225* | (2006.01) | |
| *H01L 21/266* | (2006.01) | |
| *H01L 29/423* | (2006.01) | |
| *H01L 29/08* | (2006.01) | |

(52) U.S. Cl.
CPC .......... *H01L 29/1095* (2013.01); *H01L 29/063* (2013.01); *H01L 29/0886* (2013.01); *H01L 29/66681* (2013.01); *H01L 29/7816* (2013.01); *H01L 21/2253* (2013.01); *H01L 21/266* (2013.01); *H01L 29/0878* (2013.01); *H01L 29/42368* (2013.01)

(58) Field of Classification Search
CPC ............ H01L 29/7816; H01L 29/1095; H01L 29/0878; H01L 29/086; H01L 29/0634; H01L 29/0886
See application file for complete search history.

(56) References Cited

U.S. PATENT DOCUMENTS 5,374,843 A * 12/1994 Williams et al. .............. 257/492
6,570,219 B1    5/2003 Rumennik et al.
(Continued)

OTHER PUBLICATIONS

U.S. Office Action issued on Mar. 20, 2015 in related U.S. Appl. No. 14/453,246 (16 pages, in English).

*Primary Examiner* — Jose R Diaz (57) ABSTRACT

There are provided a semiconductor device and a method of manufacturing the same. The semiconductor device includes a source region disposed apart from a drain region, a first body region surrounding the source region, a deep well region disposed below the drain region, and a second body region disposed below the first body region. A bottom surface of the second body region is not coplanar with a bottom surface of the deep well region, and the first body region has a different conductivity type from the second body region.

22 Claims, 7 Drawing Sheets

(56) References Cited

U.S. PATENT DOCUMENTS

| | | |
|---|---|---|
| 6,903,421 B1 | 6/2005 | Huang et al. |
| 6,995,428 B2 * | 2/2006 | Huang ............... H01L 29/0634 257/213 |
| 7,173,308 B2 * | 2/2007 | Kitaguchi .................... 257/342 |
| 7,265,416 B2 * | 9/2007 | Choi et al. .................... 257/343 |
| 7,436,024 B2 * | 10/2008 | Kumagai et al. ............. 257/335 |
| 7,812,402 B2 * | 10/2010 | Hatade ............ H01L 21/823814 257/168 |
| 8,786,016 B2 * | 7/2014 | Jang .................... H01L 29/7816 257/141 |
| 2010/0148254 A1 | 6/2010 | Park |
| 2012/0112277 A1 * | 5/2012 | Denison et al. ............... 257/337 |
| 2013/0341718 A1 | 12/2013 | Kim et al. |
| 2014/0070311 A1 | 3/2014 | Yang et al. |

* cited by examiner

| Split | BVDSS |
|---|---|
| Non-isolated | 803.43 |
| Split-1 | 79.423 |
| Split-2 | 439.34 |
| Split-3 | 795.73 |
| Split-4 | 794.74 |
| Split-5 | 764.74 |
| Split-6 | 786.96 |

SEMICONDUCTOR DEVICE

CROSS-REFERENCE TO RELATED APPLICATION

This application claims priority under 35 USC 119(e) of U.S. Patent Application No. 61/863,978, filed on Aug. 9, 2013, and under 35 U.S.C. §119(a) of Korean Patent Application No. 10-2013-0095040 filed on Aug. 9, 2013, in Korean Intellectual Property Office, the entire disclosure of which are incorporated herein by reference for all purposes.

BACKGROUND

1. Field

The following description relates to a semiconductor device, and to a high-voltage lateral MOSFET semiconductor device having an increased breakdown voltage without a separate epitaxial layer or buried layer formed therein and a method of fabricating such a high-voltage lateral MOSFET device.

2. Description of Related Art

In a conventional N-type lateral double diffused metal oxide semiconductor transistor (LDMOS), a body region that includes a source region is connected to a ground power supply. The breakdown voltage from an N+ source region to the body region of the N-type LDMOS is restricted in its range. For instance, the breakdown voltage is restricted to about 20 V or less.

Various methods for increasing the low breakdown voltage of LDMOS devices have been suggested. For example, there have been suggested a method of forming an expanded deep well so as to surround the body region and a method of forming an N-diffusion region so as to surround the N+ source region. It is possible to increase the breakdown voltage by a certain level by applying the above-described methods. However, the range of breakdown voltage achieved does not reach approximately 100 V or greater. Further, the cost for producing MOSFET devices is increased with these methods due to the need for additional manufacturing steps.

Further, there has been suggested a method of fully isolating the body region from a substrate by forming a thick epitaxial layer on the substrate and forming a buried layer between the substrate and the deep well region. Unfortunately, a technical configuration in which the buried layer and the thick epitaxial layer are formed is undesirable as a high unit price is needed. Also, there are many applications that do not require the technical configuration in which the body region is fully isolated from the substrate.

Patent Literature 1: Korea Patent Laid-Open Publication No. 10-1998-074299

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor device includes a source region disposed apart from a drain region, a first body region surrounding the source region, a deep well region disposed below the drain region, and a second body region disposed below the first body region, in which a bottom surface of the second body region is not coplanar with a bottom surface of the deep well region, and the first body region has a different conductivity type from the second body region.

The source region and the drain region may be disposed in a substrate.

The second body region may have a shallower depth than the deep well region.

The deep well region may have an impurity concentration that is different from an impurity concentration of the second body region.

The second body region may have an impurity concentration that is lower than an impurity concentration of the deep well region.

At least one dip may be disposed at the bottom surface of the second body region.

In another general aspect, a semiconductor device includes a body region disposed in a substrate and surrounding a source region, and a deep well region disposed in the substrate and surrounding the body region and a drain region, in which a depth of a portion of the deep well region below the body region is different from a depth of a portion of the deep well region below the drain region, and the body region has a different conductivity type from the deep well region.

The depth of the portion of the deep well region below the body region may be shallower than the depth of the portion of the deep well region below the drain region.

The portion of the deep well region below the body region and the portion of the deep well region below the drain region may have different impurity concentrations from each other.

The portion of the deep well region below the body region may have an impurity concentration that is lower than an impurity concentration of the portion of the deep well region below the drain region.

The body region and the portion of the deep well region below the body region may form a PN junction region.

A conductivity type of the body region may be different from a conductivity type of the deep well region.

In another general aspect, a semiconductor device may include a substrate having a first conductivity type, a source region and a drain region disposed on the substrate, a first body region having a first conductivity type that surrounds the source region, a deep well having a second conductivity type and disposed below the drain region, and a second body region having a second conductivity type and disposed below the first body region, in which the second body region has a different depth from a depth of the deep well.

The second body region may have a shallower depth than a depth of the deep well.

The deep well and the second body region may have different impurity concentrations from each other.

The second body region may have an impurity concentration lower than an impurity concentration of the deep well.

The general aspect of the semiconductor device may further include a buried layer having a first conductivity type that is disposed in the deep well.

The general aspect of the semiconductor device may further include a buried layer having a first conductivity type that is disposed below the first body region.

The buried layer may have an impurity concentration that is higher than an impurity concentration of the first body region.

In another general aspect, a method of forming a semiconductor device including a source region and a drain region of a first conductivity type, the source region disposed in a body region, and the drain region disposed in a deep well region is provided, the method involving: forming the deep well region of a first conductivity type in a substrate using a mask having a plurality of openings, and forming the body region of a second conductivity type in the deep well region, in which a portion of the deep well region under the body region has a shallower depth than a portion of the deep well region under the drain region.

At least one dip may be disposed at a bottom surface of the deep well region.

Other features and aspects will be apparent from the following detailed description, the drawings, and the claims.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Further, it will be understood that although the terms "first", "second", etc. may be used herein to describe various elements, the elements should not be limited by these terms. These terms are only used to distinguish one element from another.

Furthermore, the terminologies used herein are for the purpose of describing particular embodiments only and are not intended to be limiting of the present invention. As used herein, the singular forms are intended to include the plural forms as well, unless the context clearly indicates otherwise. It is understood that the use of the term "comprises", "comprising", "include" or "including" in this specification is taken to specify the presence of stated features, integers, steps, operations, elements, components or combinations thereof, but does not preclude the inclusion of one or more additional features, integers, steps, operations, elements, components or combinations thereof.

Moreover, spatially relative terms such as "below", "beneath", "lower", "above" and "upper" may be used herein to easily describe a correlation between one device or another element and another device or element as illustrated in the drawings. It will be understood that spatially relative terms are intended to encompass different orientations of the device in use or operation in addition to the orientation depicted in the drawings. For example, if the device in the drawings is turned over, a device described as being on the "below" or "beneath" of another device would then be oriented on "above" or "upper" of another device. Therefore, the exemplary terms may encompass both an orientation of above and below. Otherwise, the device may be oriented, and thus the spatially relative terms used herein may be interpreted depending on the orientation.

In addition, the terms "first conductivity type" and "second conductivity type" represent opposite conductivity type types such as P-type or N-type, and the embodiments described herein include complementary embodiments. According to one embodiment, a case where a first conductivity type is P-type and a second conductivity type is N-type will be described below.

Hereinafter, various examples will be described in detail with reference to the accompanying drawings. According to one example, a semiconductor device capable of increasing the breakdown voltage between a source region and a substrate without forming a thick epitaxial layer and a buried layer are described. According to another example, a semiconductor device capable of being manufactured without performing additional steps that would otherwise result in higher manufacturing cost is described. However, the present description is not limited thereto.

Figure 1:
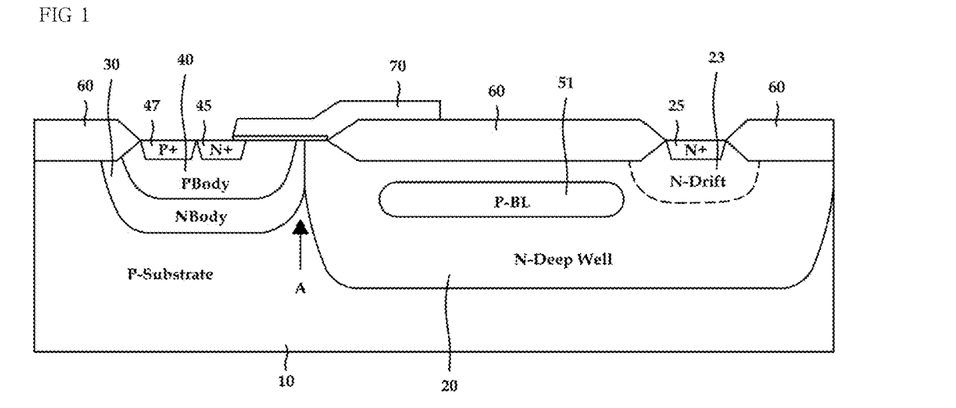
FIG. 1 is a diagram illustrating an example of a semiconductor device.

FIG. 1 is a diagram illustrating a first example of a semiconductor device. The example of semiconductor device illustrated in FIG. 1 is a "triple RESURF" version of a semiconductor device. The term "RESURF" stands for "reduced surface field," and the term refers to a method of producing high voltage devices with low on-resistance on a thin epitaxial layer. However, the semiconductor device of the present application is not limited to a triple RESURF device, and the concept also applies to other types of lateral MOSFETs, such as a standard MOSFET with no RESURF, single RESURF and double RESURF, as well as structures beyond "triple RESURF".

As illustrated in FIG. 1, the semiconductor device according to the first example is formed on a P-type substrate 10. The semiconductor device further includes an N-type deep well 20 including an N+ drain 25; an N-type body region 30 that partially touches one lateral surface of the N-type deep well 20 and is formed at a depth shallower than that of the N-type deep well 20; and a P-type body region 40 that is formed within the N-type body region 30 and includes a source region 45.

Referring to FIG. 1, the N-type body region 30 touches the P-type substrate 10. Thus, the P-type body region 40 and the source region 45 are formed to be isolated from the P-type substrate 10. By being isolated from the P-type substrate 10, the source region 45 and the P-type substrate 10 can be maintained at different potentials from each other. Further, since the N-type body region 30 and the P-type body region 40 touch each other, a PN junction region may be formed.

The N-type deep well 20 is formed on the P-type substrate 10. The N+ drain region 25 is formed within the N-type deep well 20, and an N-type low-resistance drift drain extension region 23 may be separately formed near the N+ drain region. The N-type deep well 20 and the N-type drift drain extension region 23 may have different impurity concentrations from each other. For example, the impurity concentration of the N-type deep well 20 may be formed to be lower than the impurity concentration of the N-type drift drain extension region 23. In this way, by forming the N-type deep well 20 to have the lower impurity concentration, the breakdown voltage of the semiconductor device can be increased.

The impurity concentration of the N+ drain 25 may be greater than the impurity concentration of the N-type drift drain extension region 23.

A P-type buried layer 51 may be formed within the N-type deep well 20. That is, as illustrated in FIG. 1, when a triple RESURF structure is formed by placing the P-type buried layer 51 within the N-type deep well 20, because a plurality of current channels are formed above and below the P-type buried layer 51, it is possible to decrease the on-resistance of the semiconductor device. FIG. 1 illustrates a structure in which the P-type buried layer 51 is formed within the N-type deep well 20. Furthermore, in order to reserve a larger current amount, more than one P-type buried layers 51 may be provided, and the plurality of P-type buried layers may be formed to be vertically separated at a regular interval.

Although FIG. 1 illustrates an example in which the P-type buried layer 51 is formed spaced apart from an upper surface of the substrate with a certain distance, the semiconductor device is not limited thereto. Further, depending on the characteristics of the semiconductor device, the P-type buried layer 51 may be formed vertically apart from a LOCOS region 60 or formed to contact the LOCOS region 60. This would form a Double RESURF device.

The N-type body region 30 and the N-type deep well 20 can be formed together from the same diffusion, or from different manufacturing steps. FIG. 1 illustrates an example in which the N-type body region 30 and the N-type deep well 20 are formed from different manufacturing steps. For example, by using the BODY mask (not shown), the N-type body region 30 is formed below the P-type body region 40. By using a deep well mask, the N-type deep well 20 is formed below the drain region. The N-type body region 30 is formed on the P-type substrate 10 so as to partially touch one lateral surface of the N-type deep well 20, and is formed at a depth different from that of the N-type deep well 20. For example, the N-type body region 30 may be formed at a depth shallower than a depth of the N-type deep well 20 by using lower implantation energy for the N-type body region 30 than that for the N-type deep well 20.

Referring to FIG. 1, a bottom surface of the N-type body region 30 is not coplanar with a bottom surface of the N-type deep well 20. That is, the bottom surface of the N-type body region is not parallel to the bottom surface of the N-type deep well, and is not in the same plane. In other words, a junction region is formed by the N-type body region 30 and the P-type body region 40, and the junction region is formed so as not to be coplanar with the N-type deep well 20.

Although FIG. 1 illustrates an example of semiconductor device in which the N-type body region 30 is formed at a uniform depth, the illustration is provided merely as an example. In other examples, the N-type body region 30 may be formed at a non-uniform depth, as illustrated, for example, in FIG. 3.

In an example according to the present disclosure, a boundary dip A is formed in a contact region between the N-type body region 30 and the N-type deep well 20. For instance, because one lateral surface of the N-type body region 30 touches partially the N-type deep well 20, the boundary dip A may be formed in a region between the N-type body region 30 and the N-type deep well 20.

Accordingly, an N-channel JFET configuration is formed below (between the body region and the drift region) of a storage region, and it is possible to maintain the maximum voltage BVdss between a drain and a source at a high level.

In one example according to the present disclosure, the N-type deep well 20 and the N-type body region 30 may have different impurity concentrations from each other. For example, the impurity concentration of the N-type body region 30 may be lower than the impurity concentration of the N-type deep well 20. In such a semiconductor device, it is possible to forms a higher impedance path for current flowing inside the N-type body region 30 below the P-type body region 40, in comparison to current flowing in a device in which the P-type body region 40 is formed in an extension of the N-type deep well 20.

Alternate to the aforementioned example, when a separate mask for forming the N-type body region 30 is used, it is possible to allow the impurity concentration of the N-type body region 30 to be higher than the impurity concentration of the N-type deep well 20. In such an example, it is possible to form a lower impedance path under the P-type body region 40. The P-type body region 40 is formed within the N-type body region 30. For example, the P-type body region 40 may be formed at a depth shallower than that of the N-type body region 30.

Further, the P-type body region 40 may include the N+ source 45 and a P+ pick-up region 47. The impurity concentration of the source region 45 and the P+ pick-up region 47 may be greater than the impurity concentration of the P-type body region 40 and the N-type body region 30.

As described above, in an example of the semiconductor device, because the N-type body region 30 is formed between the P-type substrate 10 and the P-type body region 40, potential of the P-type body region 40 can be applied differently from that of the P-type substrate 10. Thus, the N+ source 45 and the P+ pick-up region 47 can be maintained at the same potential, so that the body effect can be minimized or eliminated. That is, the potential of the P-type body region 40 can be higher than that of the P-type substrate 10 without impacting critical electrical parameters such as threshold voltage.

Such a semiconductor device can operate as N-type LDMOS by further including a LOCOS oxidation film 60, a gate electrode 70 and a salicide region. It should be understood to those skilled in the art that a process and a device configuration required to operate as the N-type LDMOS are implemented in modified forms without departing from essential characteristics of the semiconductor device.

Figure 2:
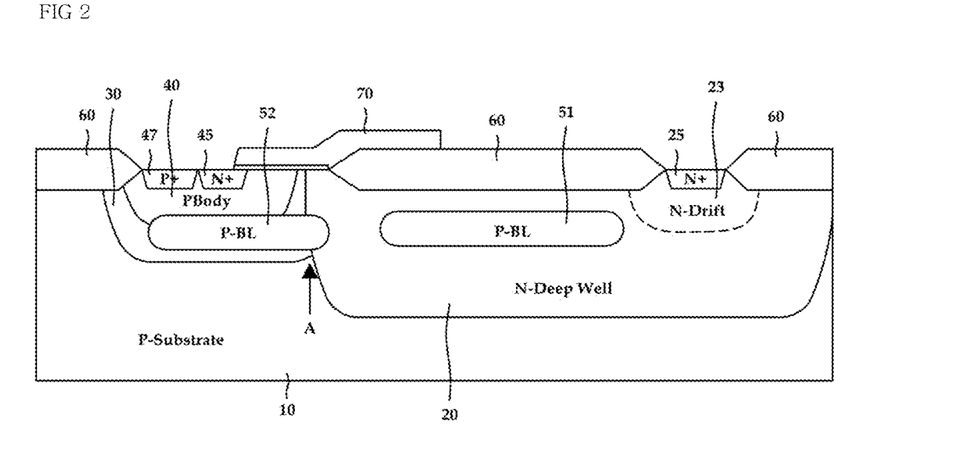
FIG. 2 is a diagram illustrating another example of a semiconductor device.

FIG. 2 is a diagram illustrating another example of a semiconductor device according to the present disclosure.

Referring to FIG. 2, the semiconductor device may further include a P-type buried layer 52 formed to overlap with a part of the N-type body region 30 or the P-type body region 40 in the semiconductor device according the first example illustrated in FIG. 1. However, the P-type buried layer 52 does not have to be higher than P-type body region 40. Depending on the example, the P-type buried layer 52, it can be higher but also can be the same or lower. The P-type buried layer 52 can be added to the P-type body region 40 to help reduce the overall body resistance and improve device robustness.

In the semiconductor device illustrated in FIG. 2, the P-type buried layer 52 and the P-type buried layer 51 are formed within the N-type deep well 20 at the same depth. However, the respective P-type buried layers 51 and 52 may be formed at different heights in other examples. Further, the P-type buried layer 52 may be formed to be closer to a surface of the semiconductor device than the P-type buried layer 51 formed within the N-type deep well 20. That is, the P-type buried layer 52 may be formed at a higher location than the P-type buried layer 51. In the alternative, the P-type buried layer 52 may be formed to be far away from the surface of the semiconductor device or at a lower position than the P-type buried layer 51. In other words, regions 51 and 52 can be formed together, from the same diffusion step, or from two or more different manufacturing steps.

Figure 3:
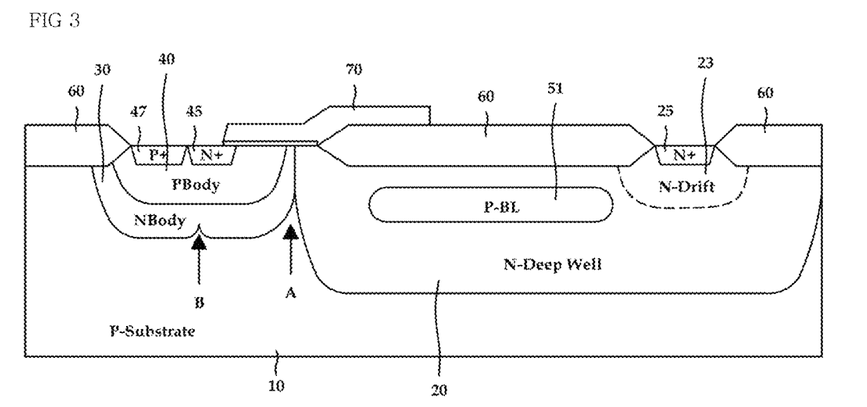
FIG. 3 is a diagram illustrating another example of a semiconductor device.

FIG. 3 is a diagram illustrating another example of a semiconductor device according to the present disclosure.

As illustrated in FIG. 3, the N-type body region 30 of the semiconductor device may have a shape different from that of the N-type body region 30 within the semiconductor device according to the first example illustrated in FIG. 1. That is, in the N-type body region 30 within the semiconductor device according to FIG. 3, at least one dip B may be formed at the bottom surface of the N-type body region 30. As illustrated in FIG. 3, a dip B refers to uneven doping area along the bottom of the N-type body region 30. The dip provides that the doping profile is not uniform along one plane.

For example, the N-type body region 30 of the semiconductor device illustrated in FIG. 1 is formed in a single well shape, and thus the bottom surface thereof has a U shape. However, since a plurality of wells are formed at intervals in FIG. 3, the N-type body region 30 of FIG. 3 may have a W shape in which one dip B is formed at the bottom surface thereof, or may have a wave shape in which a plurality of dips Bare formed at the bottom surface thereof. Accordingly, it is possible to increase the breakdown voltage of the semiconductor device in a reverse-biased state between the N-type drain region 25 and the source region 45. That is, since a distance between the P-type body region 40 and the P-type substrate 10 is shorter than those in other positions due to a portion where the dip is formed, a depletion region is easily reserved.

Figure 4:
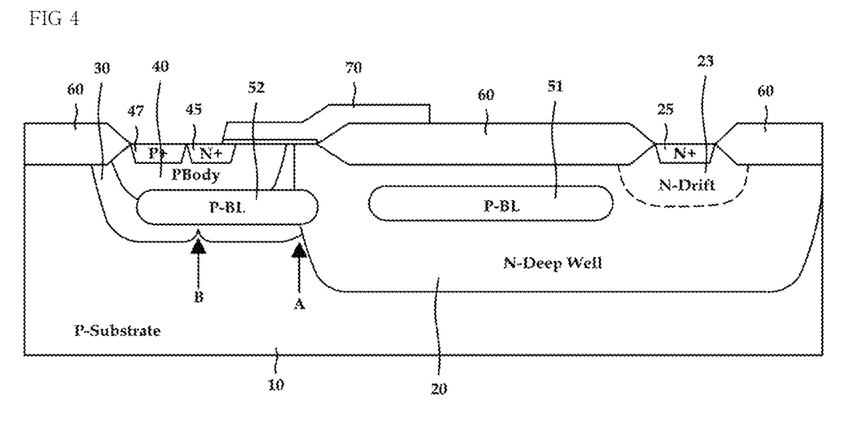
FIG. 4 is a diagram illustrating another example of a semiconductor device.

FIG. 4 is a diagram illustrating another example of a semiconductor device according to the present disclosure. Referring to FIG. 4, in the semiconductor device according to FIG. 4, a P-type buried layer may be further formed so as to overlap with the P-type body region 40 or the N-type body region 30 in the semiconductor device according to FIG. 3.

Hereinafter, other applicable examples of the semiconductor device according to the present disclosure will be described in detail with reference to FIGS. 5 to 7.

Figure 5:
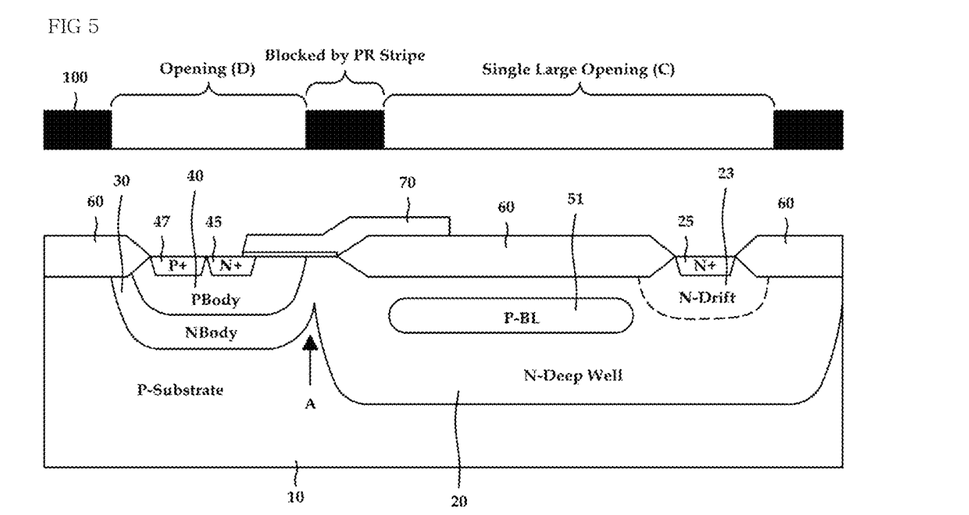
FIG. 5 is a diagram illustrating another example of a semiconductor device.

FIG. 5 is a diagram illustrating another example of a semiconductor device according to the present disclosure.

As shown in FIG. 5, the N-type deep well 20 and the N-type body region 30 may be integrally formed. In order to further explain the above-described configuration, FIG. 5 illustrates a deep well mask 100 for forming the above-described configuration. In this example, no body mask is used only for formation of the N-type body region 30.

For example, by using the deep well mask 100, a space C for forming the deep well and a space D for forming the N-type body are open. By using the deep well mask 100 having the configuration described above, N-type impurities, for example, phosphorus (P), arsenic (As) or Antimony (Sb) are simultaneously implanted, so that the N-type deep well 20 and the N-type body region 30 can be simultaneously formed. Thus, the N-type deep well 20 exists below the drain region and also exists below the P-type body region 40. For the sake of convenience, the deep well region existing below the P-type body region 40 is called the N-type body region 30.

The ion implantation is limited by a mask pattern existing at a boundary between the N-type deep well region 20 and the N-type body region 30, and thus a boundary dip A can be formed at a boundary region between the N-type deep well 20 and the N-type body region 30. In a process subsequent to the ion implantation, because two regions meet each other through heat treatment for diffusion, a region near the boundary dip A may have a concentration relatively lower than those of the N-type deep well region 20 and the N-type body region 30.

Furthermore, as illustrated in FIG. 5, in order to secure a more compact device area, it is defined that the space C for forming the N-type deep well region 20 has a distance shorter than that of the space D for forming the N-type body region 30. Thus, the regions are formed at different depths from each other. Even though ions are implanted at the same energy, the ion implantation is affected by the distances of the respective spaces. A depth of an ion-implanted region of a space having a narrower width is shallower than a depth of an ion-implanted region of a space having a relatively wider width. That is, a depth from the deep well region positioned below the P-type body region 40 or the N-type body region 30 to the surface of the substrate may be shallower when formed to be different from a depth of the deep well region below the drain. Similarly, a concentration of an ion-implanted region of a space having a narrower width is lower than a concentration of an ion-implanted region of a space having a relatively wider width. Even though ions are implanted at the same dose, because the ions are implanted to the small space, a distribution of the implanted dose is relatively less than that of the large space. Due to the less distribution, a diffused amount is also small, and thus the small space has a lower concentration of dopants. Therefore, the impurity concentration of the N-type body region 30 may be lower than the impurity concentration of the N-type deep well 20.

When there is no mask pattern existing at the boundary between the N-type deep well region 20 and the N-type body region 30 (Split-1 in FIG. 8A), the N-type deep well 20 and the N-type body region 30 have the same depth. In this example, since the N-type body region 30 existing below the P-type body region 40 is formed very deeply in a direction of the P-type substrate 10 in comparison to the example described with reference to FIG. 5, a distance between the P-type body region 40 and the P-type substrate 10 is considerably larger, and thus a sufficient depletion region in a direction from the P-type body region 40 to the N-type body region 30 in the reverse-biased state is not secured. For this reason, breakdown may occur at a low voltage.

Other technical configurations have been already described above, and thus descriptions thereof will not be presented.

Figure 6:
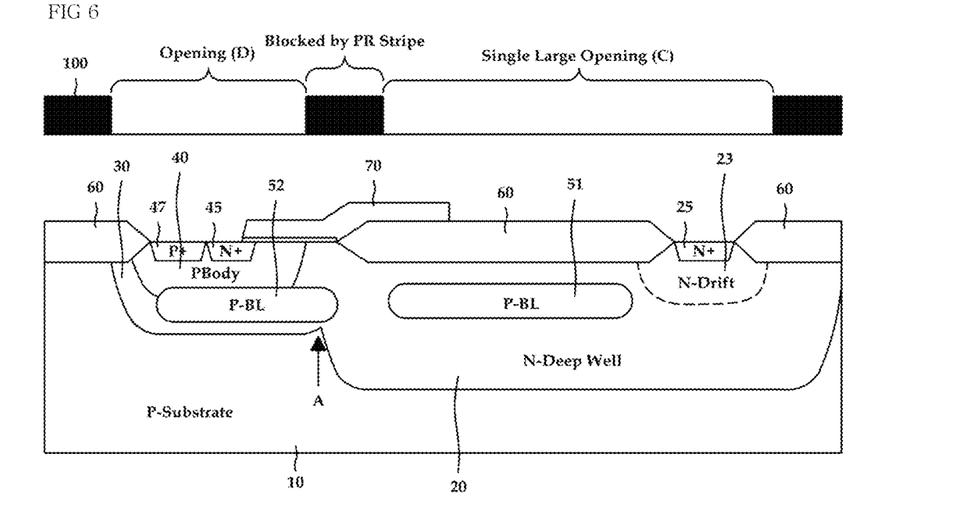
FIG. 6 is a diagram illustrating another example of a semiconductor device.

FIG. 6 is a diagram illustrating another example of a semiconductor device.

As illustrated in FIG. 6, the semiconductor device according may further include a P-type buried layer 52 formed so as to overlap with a part of the N-type body region 30 or the P-type body region 40 in the semiconductor device according to FIG. 5.

Although it has been illustrated in FIG. 6 that the P-type buried layer 52 and the P-type buried layer 51 formed within the N-type deep well 20 are formed at the same depth, the respective P-type buried layers 51 and 52 may be formed at different heights. The P-type buried layer 52 may be formed to be close to the surface of the semiconductor device, or at a higher location, than the P-type buried layer 51 formed within the N-type deep well 20, as illustrated in FIG. 6. In the alternative, the P-type buried layer 52 may be formed to be far away from the surface of the semiconductor device or at a lower position than the P-type buried layer 51.

Other technical configurations have been already described above, and thus descriptions thereof will not be presented.

Figure 7:
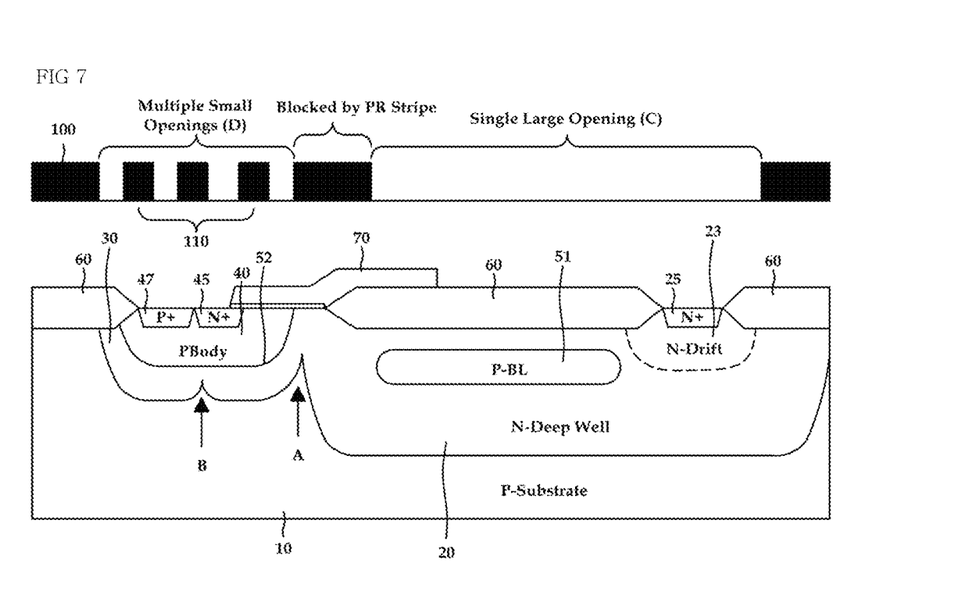
FIG. 7 is a diagram illustrating another example of a semiconductor device

FIG. 7 is a diagram illustrating another example of a semiconductor device.

Referring to FIG. 7, a mask pattern D of the deep well mask 100 may be provided with multiple small openings using slits 110 instead of a single opening.

At this time, when ions are implanted using the deep well mask 100 having the configuration described above, since a plurality of wells are formed at intervals as shown in FIG. 7, the N-type body region 30 may have a W shape in which one dip B is formed at the bottom surface thereof, or may have a wave shape in which a plurality of dips B are formed at the bottom surface thereof. When many slits 110 are used, since a space to which ions are implanted is narrowed, the N-type body region 30 is formed at an impurity concentration lower than that in the case of not using the slit. Thus, the impurity concentration of the N-type body region 30 may be lower than the impurity concentration of the N-type deep well 20. Effects obtained from such shapes will be described in FIG. 8A.

Other technical configurations have been already described above, and thus descriptions thereof will not be presented.

Figure 8A:
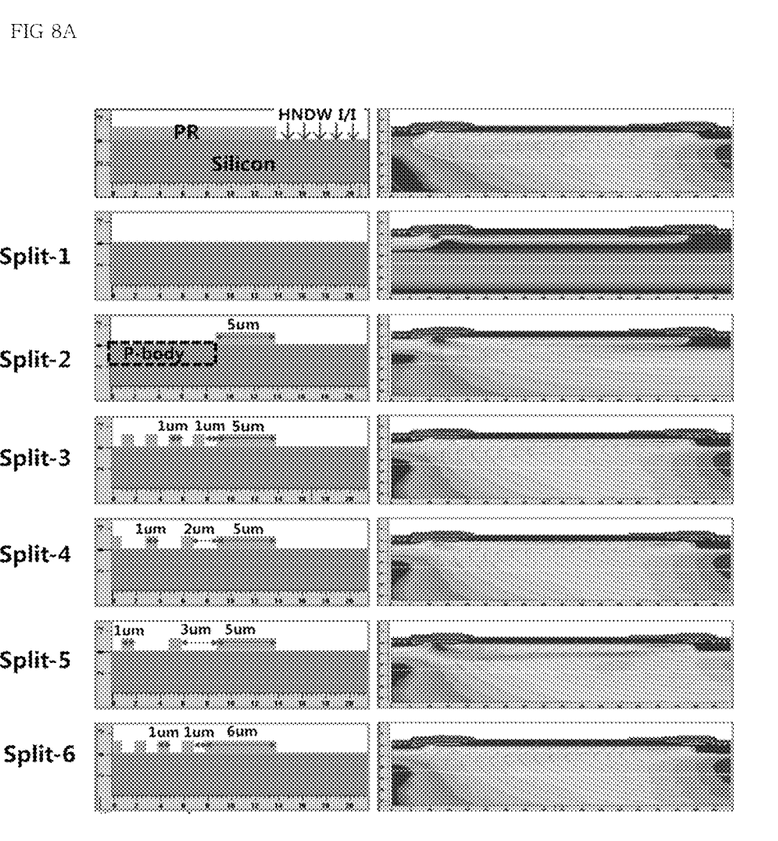
FIGS. 8A, 8B AND 8C are diagrams illustrating various simulation results for formation of the semiconductor devices according to FIGS. 5 and 7.
Figure 8B:
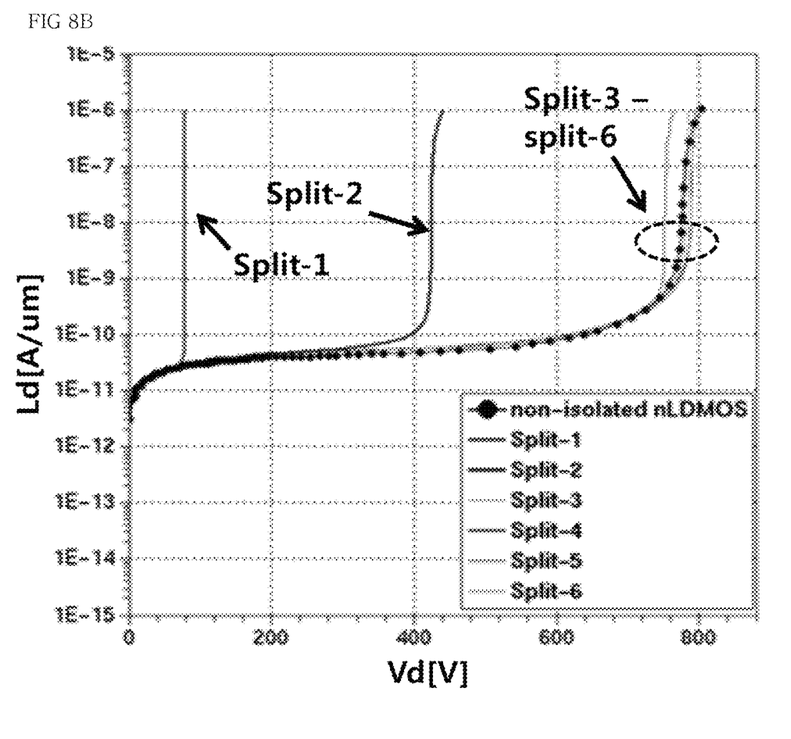
Figure 8C:
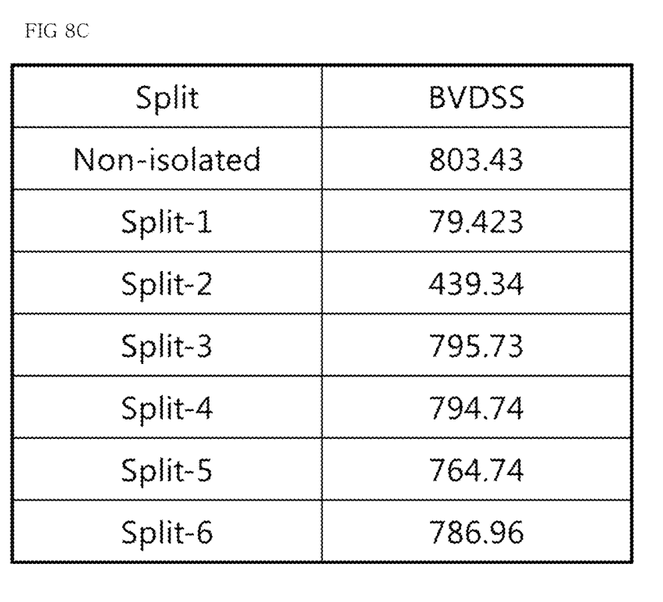

FIGS. 8A, 8B AND 8C are diagrams illustrating various 2D simulation results for formation of the semiconductor devices according to FIG. 5 and FIG. 7 of the present disclosure.

First, Split-1 illustrates a case in which the mask pattern is not formed at the boundary between the N-type deep well 20 and the N-type body region 30 (first figure on the left side). Thus, the N-type deep well 20 and the N-type body region 30 have the same depth. That is, the N-type deep well and the N-type body region are coplanar with each other. Thus, in Split-1, referring to a simulation result for an electric field (first figure in the middle), the P-type body region as well as a region below the LOCOS region represents a very high electric field. For this reason, as can be seen from a $V_d$-$I_d$ graph (figure on the right upper side) of FIG. 8B and Table (figure on the right lower side) of FIG. 8C, the breakdown occurs in a very low voltage of 79 V.

Split-2 illustrates a case in which the mask pattern is formed at the boundary between the N-type deep well 20 and the N-type body region 30 (second figure on the left side). That is, a case similar to the example illustrated in FIG. 5 is shown. Referring to a simulation result for such a case (second figure in the middle), it can be seen that a region below the LOCOS region represents a more uniform electric field than that in Split-1, but an electric field value near the P-type body region 40 is still darker than that in other regions. Thus, as can be seen from a $V_d$-$I_d$ graph (figure on the right upper side) and Table (figure on the right lower side), the breakdown still occurs in a low voltage of 439 V lower than a target value.

Split-3 to Split-6 illustrate cases in which the mask pattern exists at the boundary between the N-type deep well 20 and the N-type body region 30 and slits are used above the N-type body region 30. In Split-3, the slits are very narrow and several slits are used. In contrast, in Split-4 or Split-5, the number of slits is reduced and a distance between the slits is increased. In Split-6, a length of the mask pattern existing at the boundary is adjusted. Here, as represented in the example illustrated in FIG. 7, in Split-3 to Split-6, the N-type body region 30 is provided with a plurality of wells at intervals, and has a W shape in which one dip is formed at the bottom surface thereof or a wave shape in which a plurality of dip B are formed at the bottom surface thereof.

From simulation results of Split-3 to Split-6 in FIGS. 8A, 8B and 8C, it can be seen that a distribution of an electric field value in the semiconductor device is stable. As can be seen from a $V_d$-$I_d$ graph and Table, in all Split-3 to Split-6, a breakdown voltage $BV_{dss}$ value between the drain and the source is increased up to 760 V to 800 V as compared with Split-1 and Split-2. This is because when the plurality of slits are formed in order to form the N-type body region 30, the N-type body region 30 is formed at a depth shallower than that in the case of not using the slit. Further, when many slits are used, since a space to which ions are implanted is narrowed, the N-type body region 30 is formed at an impurity concentration lower than that in the case of not using the slit. Due to a decrease in the depth and concentration, a depletion region from the P-type body region 40 toward the N-type body region 30 is easily secured to increase the $BV_{dss}$ value.

As set forth above, since a semiconductor device according to various examples includes a body region having a second conductivity type that is formed at a depth different from that of a deep well having a second conductivity type including a drain region and is formed to fully surround a body region having a first conductivity type including a source region, it is possible to increase breakdown voltage without separately forming a thick epitaxial layer and a buried layer.

Further, because the body region having a second conductivity type is formed, it is possible to increase the breakdown voltage between the source region and the body region having a first conductivity type, and also to isolate the source region and the body region having a first conductivity type from a substrate having a first conductivity type. Accordingly, it is possible to apply potential or voltage higher than that of a substrate region to the source region or the body region having a first conductivity type.

Furthermore, because the body region having a second conductivity type is formed at a depth shallower than that of the deep well having a second conductivity type, the body region having a second conductivity type is possible to provide a higher impedance path as compared with a structure which is formed with the same depth.

In addition, with such a configuration, it is possible to increase potential of the body region more than that of the substrate without influencing maximum voltage BVdss between the drain and source.

In addition, it is possible to remove a body effect by connecting the body region and the source region.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device comprising:
   a source region disposed apart from a drain region;
   a first body region surrounding the source region;
   a deep well region disposed below the drain region;
   a buried region having conductivity opposite that of the deep well region formed within the deep well region; and
   a second body region disposed below the first body region,
   wherein a bottom surface of the second body region forms a discontinuous step with a bottom surface of the deep well region such that deep well region is deeper than the second body region,
   wherein the first body region has a different conductivity type from the second body region, and
   wherein at least one dip is disposed at the bottom surface of the second body region.

2. The semiconductor device according to claim 1, wherein the source region and the drain region are disposed in a substrate.

3. The semiconductor device according to claim 1, wherein the deep well region has an impurity concentration that is different from an impurity concentration of the second body region.

4. The semiconductor device according to claim 1, wherein the second body region has an impurity concentration that is lower than an impurity concentration of the deep well region.

5. The semiconductor device according to claim 1, wherein a boundary dip is formed at a boundary region between the second body region and the deep well region.

6. The semiconductor device according to claim 5, wherein a portion near the boundary dip has an impurity concentration lower than those of the second body region and the deep well region.

7. A method of forming the semiconductor device according to claim 1, the method comprising:
   forming the deep well region of a first conductivity type and the second body region of the first conductivity type in a substrate using a mask having a plurality of openings; and
   forming the first body region of a second conductivity type in the second body region,
   wherein the second body region has a shallower depth than the deep well region under the drain region.

8. The method of claim 7, wherein at least one dip is disposed in a region between the first body region and the deep well region.

9. A semiconductor device comprising:
   a body region disposed in a substrate and surrounding a source region;
   a deep well region disposed in the substrate and surrounding the body region and a drain region; and
   a buried region having conductivity opposite that of the deep well region formed within the deep well region,
   wherein a bottom surface of a portion of the deep well region below the body region forms a discontinuous step with a bottom surface of a portion of the deep well region below the drain region,
   wherein the body region has a different conductivity type from the deep well region, and
   wherein at least one dip is disposed at the portion of the deep well region below the body region.

10. The semiconductor device according to claim 9, wherein the portion of the deep well region below the body region and the portion of the deep well region below the drain region have different impurity concentrations from each other.

11. The semiconductor device according to claim 9, wherein the portion of the deep well region below the body region has an impurity concentration that is lower than an impurity concentration of the portion of the deep well region below the drain region.

12. The semiconductor device according to claim 9, wherein the body region and the portion of the deep well region below the body region form a PN junction region.

13. The semiconductor device according to claim 9, wherein a boundary dip is formed at a boundary region between the portion of the deep well region below the body region and the portion of the deep well region below the drain region.

14. The semiconductor device according to claim 13, wherein a portion near the boundary dip has an impurity concentration lower than those of the portion of the deep well region below the body region and the portion of the deep well region below the drain region.

15. A semiconductor device comprising:
    a substrate having a first conductivity type;
    a source region and a drain region disposed on the substrate;
    a first body region having a first conductivity type that surrounds the source region;
    a deep well having a second conductivity type and disposed below the drain region;
    a buried region having the first conductivity type formed within the deep well region; and
    a second body region having a second conductivity type and disposed below the first body region,
    wherein a bottom surface of the second body region forms a discontinuous step with a bottom surface of the deep well such that the deep well is deeper than the second body region, and
    wherein at least one dip is disposed at the bottom surface of the second body region.

16. The semiconductor device according to claim 15, wherein the deep well and the second body region have different impurity concentrations from each other.

17. The semiconductor device according to claim 15, wherein the second body region has an impurity concentration lower than an impurity concentration of the deep well.

18. The semiconductor device according to claim 15, further comprising:
    a buried layer having a first conductivity type that is disposed below the first body region.

19. The semiconductor device according to claim 18, wherein the buried layer has an impurity concentration that is higher than an impurity concentration of the first body region.

20. The semiconductor device according to claim 18, wherein the buried region is spaced apart from the buried layer.

21. The semiconductor device according to claim 15, wherein a boundary dip is formed at a boundary region between the second body region and the deep well.

22. The semiconductor device according to claim 21, wherein a portion near the boundary dip has an impurity concentration lower than those of the second body region and the deep well.

* * * * *